United States Patent
Kim et al.

(10) Patent No.: US 8,691,617 B2
(45) Date of Patent: Apr. 8, 2014

(54) METHOD OF MANUFACTURING IMAGE SENSOR HAVING BACKSIDE ILLUMINATION STRUCTURE

(75) Inventors: Sang-hoon Kim, Seongnam-si (KR); Byung-jun Park, Yongin-si (KR); Hee-chul An, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/477,184

(22) Filed: May 22, 2012

(65) Prior Publication Data

US 2013/0017646 A1    Jan. 17, 2013

(30) Foreign Application Priority Data

Jul. 12, 2011  (KR) .......................... 10-2011-0072567

(51) Int. Cl.
*H01L 21/00*    (2006.01)

(52) U.S. Cl.
USPC ............................................. 438/72; 438/70

(58) Field of Classification Search
USPC ...................................................... 438/70, 72
See application file for complete search history.

(56) References Cited

U.S. PATENT DOCUMENTS

| | | | |
|---|---|---|---|
| 7,485,486 B2 | 2/2009 | Zheng et al. | |
| 7,939,359 B2 * | 5/2011 | Ohgishi | 438/57 |
| 8,514,308 B2 * | 8/2013 | Itonaga et al. | 348/294 |
| 2008/0150057 A1 * | 6/2008 | Lee et al. | 257/432 |
| 2011/0102657 A1 * | 5/2011 | Takahashi et al. | 348/308 |
| 2011/0157445 A1 * | 6/2011 | Itonaga et al. | 348/308 |

FOREIGN PATENT DOCUMENTS

| | | |
|---|---|---|
| JP | 2001-320079 A | 11/2001 |
| KR | 10-2010-0050330 A | 5/2010 |

* cited by examiner

*Primary Examiner* — Luan C Thai
(74) *Attorney, Agent, or Firm* — Lee & Morse, P.C.

(57) ABSTRACT

A method of manufacturing an image sensor having a backside illumination (BSI) structure includes forming a wiring unit on a front side of a semiconductor substrate, forming an anti-reflective layer in an active pixel sensor (APS) region on a back side of the semiconductor substrate, a photodiode being between the back and front sides of the semiconductor substrate, forming an etch stopping layer on the anti-reflective layer, forming an interlayer insulating layer on the etch stopping layer, the interlayer insulating layer having an etch selectivity with respect to the etch stopping layer, and etching the interlayer insulating layer in the APS region using the etch stopping layer as an etch stopping point.

20 Claims, 9 Drawing Sheets

METHOD OF MANUFACTURING IMAGE SENSOR HAVING BACKSIDE ILLUMINATION STRUCTURE

CROSS-REFERENCE TO RELATED APPLICATIONS

This application claims the benefit of Korean Patent Application No. 10-2011-0072567, filed on Jul. 12, 2011, in the Korean Intellectual Property Office, the disclosure of which is incorporated herein in its entirety by reference.

BACKGROUND

1. Field

The inventive concept relates to a method of manufacturing an image sensor, and more particularly, to a method of manufacturing an image sensor having a backside illumination (BSI) structure.

2. Description of the Related Art

An image sensor refers to a semiconductor device that converts an optical image to an electrical signal. The image sensor may be classified as a front side-illuminating image sensor, in which light is incident on a front side of a substrate on which a wiring line is disposed, and as an image sensor having a backside illumination (BSI) structure, in which light is incident on a back side opposite to a front side of a substrate on which a wiring line is disposed.

SUMMARY

The inventive concept provides a method of manufacturing an image sensor having a backside illumination (BSI) structure, in which deterioration of characteristics of the image sensor may be prevented, and also, a pad metal layer and an external connection terminal may be easily formed.

According to an aspect of the inventive concept, there is provided a method of manufacturing an image sensor having a BSI structure, the method including forming a wiring unit on a front side of a semiconductor substrate, forming an anti-reflective layer in an active pixel sensor (APS) region on a back side of the semiconductor substrate, a photodiode being between the back and front sides of the semiconductor substrate, forming an etch stopping layer on the anti-reflective layer, forming an interlayer insulating layer on the etch stopping layer, the interlayer insulating layer having an etch selectivity with respect to the etch stopping layer, and etching the interlayer insulating layer in the APS region using the etch stopping layer as an etch stopping point.

Forming the etch stopping layer may include sequentially forming a first etch stopping layer and a second etch stopping layer on the anti-reflective layer, the second etch stopping layer having an etch selectivity with respect to each of the first etch stopping layer and the interlayer insulating layer.

The method may further include etching the second etch stopping layer, etching the interlayer insulating layer including using the second etch stopping layer as the etch stopping point, and etching the second etch stopping layer including using the first etch stopping layer as an additional etch stopping point.

The interlayer insulating layer and the first etch stopping layer may be formed of silicon oxide, and the second etch stopping layer may be formed of silicon nitride.

Etching the interlayer insulating layer may include reducing a thickness of the etch stopping layer, the reduced thickness of the etch stopping layer being substantially uniform in the APS region.

Reducing the thickness of the etching stopping layer may include forming a layer with a thickness of about 50 Å to about 500 Å.

The method may further include, after etching the interlayer insulating layer, etching the etch stopping layer to expose the anti-reflective layer in the APS region.

The method may further include, after forming the wiring unit on the front side of the semiconductor substrate, attaching a support substrate to the wiring unit, and polishing the back side of the semiconductor substrate.

According to an aspect of the inventive concept, there is also provided a method of manufacturing an image sensor having a BSI, including forming a wiring unit on a front side of a semiconductor substrate, the wiring unit including a wiring layer, forming an anti-reflective layer in an APS region and in a PC region on a back side of the semiconductor substrate, a photodiode being between the back and front sides of the semiconductor substrate, forming an etch stopping layer on the anti-reflective layer, forming an interlayer insulating layer on the etch stopping layer, the interlayer insulating layer having an etch selectivity with respect to the etch stopping layer, forming a pad metal layer in the PC region, the pad metal layer being electrically connected to the wiring layer, forming a pad insulating layer having a pad opening portion on the back side of the semiconductor substrate, the pad opening portion exposing the pad metal layer, etching the interlayer insulating layer in the APS region using the etch stopping layer as an etch stopping point, and forming an external connection terminal on the pad metal layer through the pad opening portion.

Forming the pad metal layer may include forming a wiring opening portion to expose the wiring layer by etching the interlayer insulating layer, the etch stopping layer, the anti-reflective layer of the PC region, and the back side of the semiconductor substrate of the PC region, forming a barrier metal layer in the wiring opening portion, the barrier metal layer being electrically connected to the wiring layer, and forming the pad metal layer on the barrier metal layer.

The method may further include forming a light blocking layer along a circumference of the APS region of the back side of the semiconductor substrate when forming the barrier metal layer.

The method may further include, before forming the wiring opening portion, polishing the back side of the semiconductor substrate.

Etching the interlayer insulating layer may include reducing a thickness of the etch stopping layer, the reduced thickness of the etch stopping layer being substantially uniform in the APS region.

Forming the etch stopping layer may include forming a stack structure of a plurality of material layers.

Forming the plurality of material layers may include forming layers having etch selectivity with respect to one another.

According to an aspect of the inventive concept, there is also provided a method of manufacturing an image sensor having a BSI, including forming a wiring unit on a front side of a semiconductor substrate, at least one photodiode being in the semiconductor substrate, forming an anti-reflective layer on a back side of the semiconductor substrate, the front and back sides of the semiconductor substrate being opposite each other, forming an interlayer insulating layer on the back side of the semiconductor substrate, excluding an APS region of the semiconductor substrate, such that a total thickness of layers in the APS region on the back side of the semiconductor substrate is smaller than a total thickness of layers in other regions on the back side of the semiconductor substrate.

The method may further include forming an etch stopping layer on the anti-reflective layer, forming the interlayer insulating layer on the etch stopping layer, the interlayer insulating layer having an etch selectivity with respect to the etch stopping layer, and etching the interlayer insulating layer in the APS region using the etch stopping layer as an etch stopping point.

Forming the interlayer insulating layer may include exposing the anti-reflective layer in the APS region.

The method may further include forming an etch stopping layer on the anti-reflective layer, before forming the interlayer insulating layer, such that one of the etch stopping layer and the anti-reflective layer is exposed in the APS region.

Exposing one of the etch stopping layer and the anti-reflective layer in the APS region may include reducing a thickness of a respective one of the etch stopping layer and the anti-reflective layer, the reduced thickness being substantially uniform in the entire APS region.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
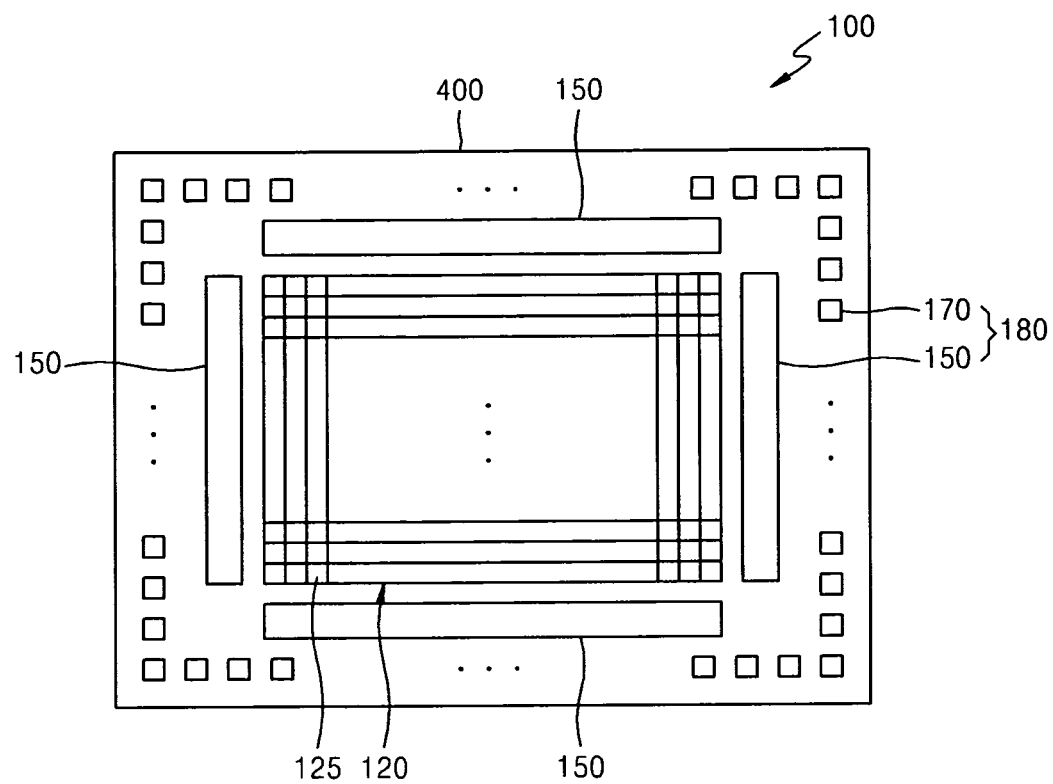
FIG. 1 illustrates a schematic diagram of an image sensor having a BSI structure according to an embodiment of the inventive concept.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer (or element) is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. In contrast, when an element is referred to as being "directly on" another element or layer, there are no intervening elements or layers present. Like reference numerals refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "below" or "lower" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the inventive concept are described herein with reference to cross-section illustrations that are schematic illustrations of idealized embodiments (and intermediate structures) of the inventive concept. As such, variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing.

FIG. 1 is a structural diagram of an image sensor 100 having a backside illumination (BSI) structure according to an embodiment of the inventive concept.

In detail, the image sensor 100 having a BSI structure may be a complementary metal-oxide semiconductor (CMOS) image sensor. The image sensor 100 may include a pixel array region 120 and a peripheral circuit (PC) region 180 comprising a logic region 150 and an external connection terminal 170 formed on a semiconductor substrate 400. The pixel array region 120 may include a plurality of unit pixels 125 arranged in a matrix.

The logic region 150 may be disposed on each of the edges of the pixel array region 120. The logic region 150 may be formed of a plurality of CMOS transistors (not shown), and a predetermined signal is supplied to each pixel of the pixel array region 120 or an output signal is controlled through the logic region 150. The external connection terminal 170 is used in transmitting and receiving an electrical signal to and from an external device.

Figure 2:
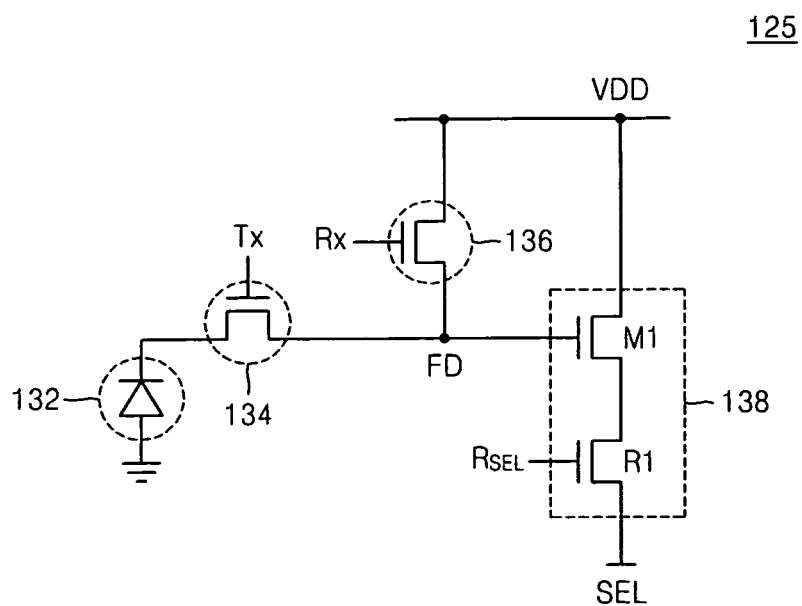
FIG. 2 illustrates a circuit diagram of a unit pixel of the image sensor having the BSI structure of FIG. 1 according to an embodiment of the inventive concept.
Figure 3:
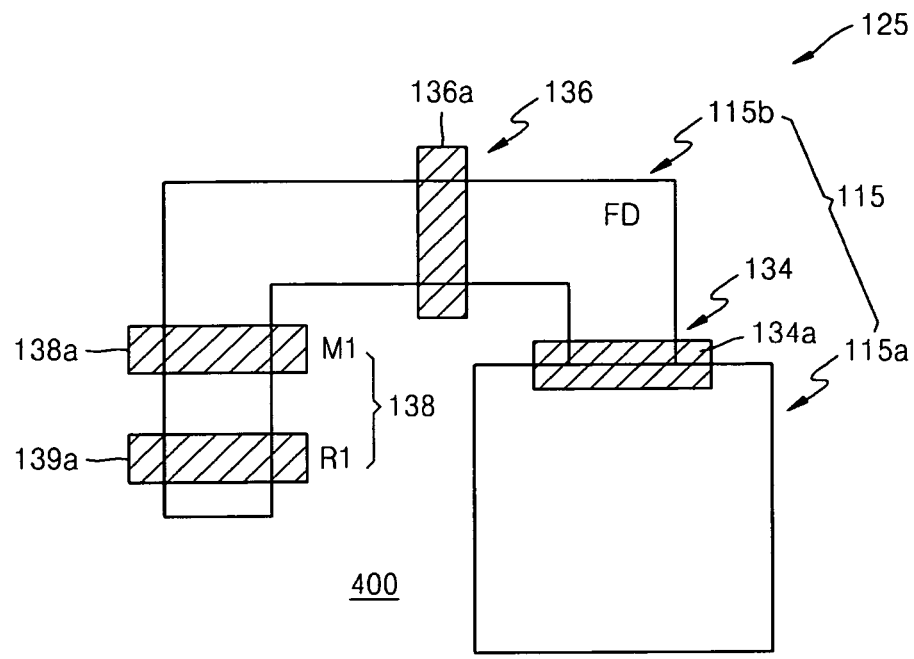
FIG. 3 illustrates a plan view of the unit pixel of FIG. 2 integrated on a semiconductor substrate, according to an embodiment of the inventive concept.

FIG. 2 is a circuit diagram illustrating a unit pixel of the image sensor 100 having the BSI structure of FIG. 1 according to an embodiment of the inventive concept. FIG. 3 is a plan view illustrating a unit pixel 125 of FIG. 2 integrated on the semiconductor substrate 400, according to an embodiment of the inventive concept.

In detail, as illustrated in FIG. 2, the unit pixel 125 may include a photodiode 132 sensing light, a transfer transistor Tx 134 transmitting charges generated by using the photodiode 132, a reset transistor Rx 136 periodically resetting a floating diffusion (FD) region in which the transmitted charges are stored, and a source follower 138 buffering a signal according to the charges in the FD region.

The source follower 138 may be formed of two serially connected metal-oxide semiconductor (MOS) transistors M1 and R1. A first end of the reset transistor Rx 136 and a first end of the MOS transistor M1 are connected to a power voltage VDD, a gate electrode of the MOS transistor R1 is connected to a row selection signal line RSEL, and the first end of the MOS transistor R1 is connected to a column selection line SEL.

The unit pixel 125 of the pixel array 120 is integrated on the semiconductor substrate 400 as illustrated in FIG. 3. That is, as illustrated in FIG. 3, an active region 115 is formed on the semiconductor substrate 400. The active region 115 may include of a photodiode region 115a and a transistor region 115b. The photodiode region 115a may be formed in a rectangular plate shape so as to occupy a predetermined portion of the semiconductor substrate 400 that is defined as a unit pixel region.

The transistor region 115b may contact a first surface of the photodiode region 115a and may be arranged to have a linear shape comprising at least one bent portion. In the transistor region 115b, a gate electrode 134a of the transfer transistor 134, a gate electrode 136a of the reset transistor 136, and gate electrodes 138a and 139a of the source follower 138 may be formed.

Figure 4:
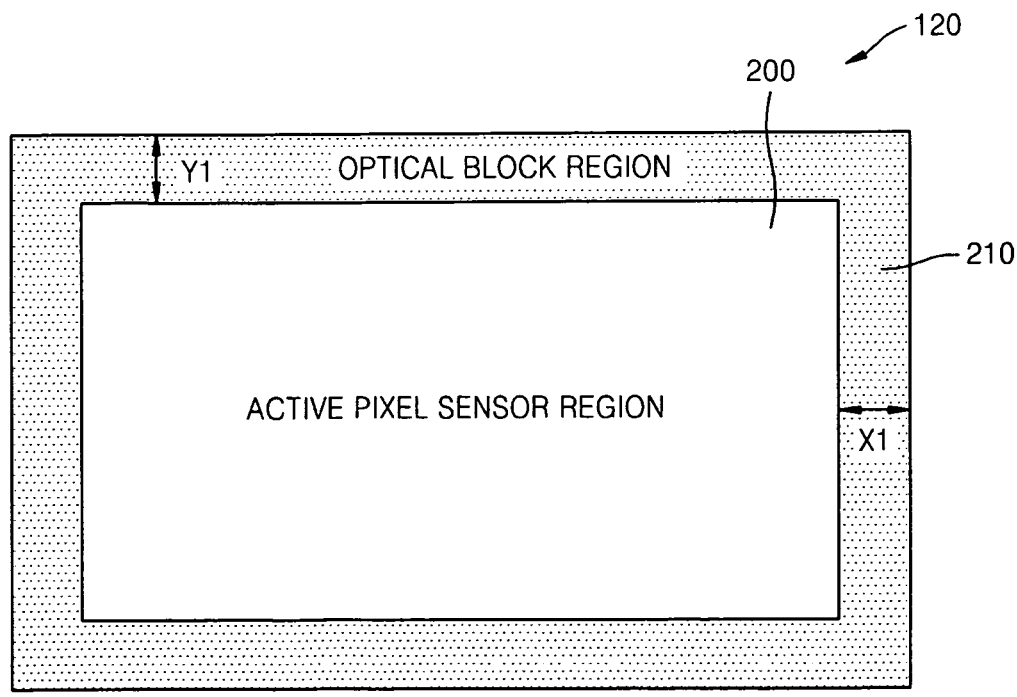
FIG. 4 illustrates a plan view of a pixel array region of an image sensor having a BSI structure according to an embodiment of the inventive concept.

FIG. 4 is a plan view illustrating a pixel array region 120 of an image sensor having a BSI structure according to an embodiment of the inventive concept. In detail, the pixel array region 120 may include an active pixel sensor (APS) region 200 and an optical block (OB) region 210 surrounding an outer circumference of the APS region 200. The APS region 200 and the OB region 210 may include both a photodiode and a MOS transistor as described above.

When an image sensor is driven, the APS region 200 senses light. The OB region 210 is used to test and evaluate electrical characteristics of the APS region 200, i.e., dark noise characteristics of a dark current, as light is blocked in the OB region 210. In other words, the OB region 210 tests dark noise characteristics due to a dark current and evaluates the same, and compensates for a current value corresponding to the dark current in the photodiode 132 of the APS region 200 based on a result of the testing and evaluating, thereby preventing dark noise from affecting an imaging device. The OB region 210 has a horizontal width X1 and a vertical width Y1 which may be arbitrarily determined according to process parameters.

Figure 5:
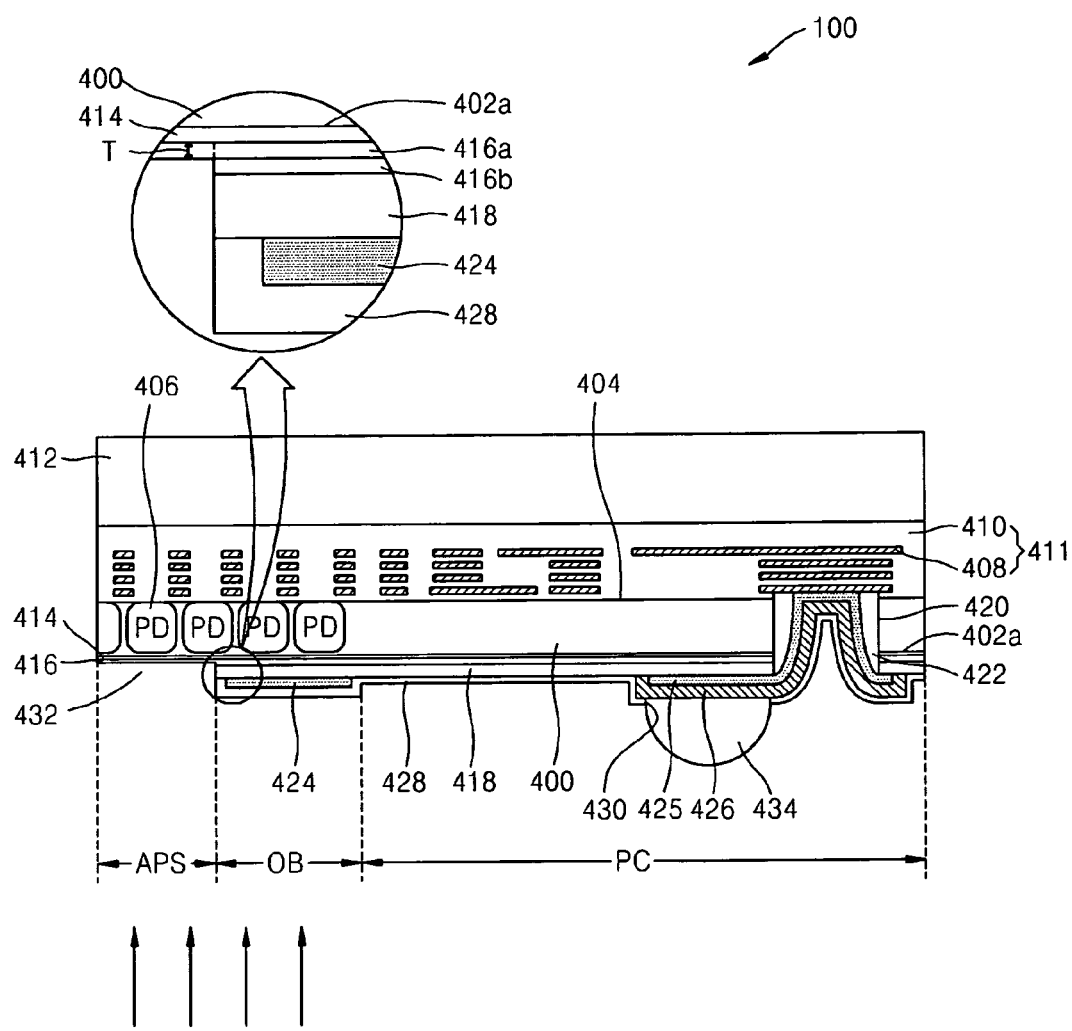
FIG. 5 illustrates a cross-sectional view of an image sensor having a BSI structure according to an embodiment of the inventive concept.

FIG. 5 is a cross-sectional view illustrating the image sensor 100 according to an embodiment of the inventive concept.

As described above, the image sensor 100 may be divided into the pixel array region 120, which includes the APS region 200 and the OB region 210, and the PC region 180 adjacent the pixel array region 120 (FIGS. 1 and 4). The pixel array region 120 and the PC region 180 may be formed on the substrate 400, which will be described in more detail below with reference to FIG. 5.

Referring to FIG. 5, the image sensor 100 may include a front side 404 and a back side 402a of the semiconductor substrate 400, and a photodiode 406 may be formed on the front side 404 of the semiconductor substrate 400. A wiring unit 411 including a wiring layer 408 and a wiring insulating layer 410 may be formed above the semiconductor substrate 400. A support substrate 412 may be attached on the wiring insulating layer 410, i.e., the wiring unit 411 may be positioned between the front side 404 of the semiconductor substrate 400 and the support substrate 412.

The image sensor 100 has a BSI structure in which light is incident on the back side 402a, i.e., a side opposite the front side 404, of the semiconductor substrate 400. The APS region may include an open area 432, in which light is incident on the back side 402a of the semiconductor substrate 400, an anti-reflective layer 414, and an etch stopping layer 416a.

The open area 432 may be formed by etching an interlayer insulating layer 418 and the etch stopping layer 416. The etch stopping layer 416 may have a stack structure in which a plurality of material layers are stacked. The plurality of material layers constituting the etch stopping layer 416 may have etch selectivity with respect to one another. For example, the etch stopping layer 416 may include a first etch stopping layer 416a formed on the anti-reflective layer 414 and a second etch stopping layer 416b formed on the first etch stopping layer 416a.

According to the current embodiment of the inventive concept, when forming the open area 432 of the APS region, at least the etch stopping layer 416a may have a small and uniform thickness on the back side 402a of the semiconductor substrate 400. The etch stopping layer 416a in the APS region may have a thickness T from about 50 Å to about 500 Å, e.g., from about 100 Å to about 400 Å. Also, a thickness distribution of the etch stopping layer 416a in the APS region of the semiconductor substrate 400 may be reduced to be within 50 Å. This will be described in detail later.

If the etch stopping layer 416a does not have a small and uniform thickness, characteristics of image sensors due to optical crosstalk may be deteriorated. As such, characteristics of the image sensors (i.e., image sensor chips) may differ according to the thickness distribution of the etch stopping layer 416a in the semiconductor substrate 400.

Alternatively, when forming the open area 432 of the APS region, the etch stopping layer 416a may be removed completely in the APS region, so the anti-reflective layer 414 may be exposed and may have a small and uniform thickness on the back side 402a of the semiconductor substrate 400. If the anti-reflective layer 414 does not have a small and uniform thickness, deterioration of characteristics of image sensors due to optical crosstalk may be caused, and characteristics of the image sensors (i.e., image sensor chips) may differ according to the thickness distribution of the anti-reflective layer 414 in the semiconductor substrate 400.

In the OB region and the PC region of the back side 402a of the semiconductor substrate 400, the anti-reflective layer 414, the etch stopping layer 416, and the interlayer insulating layer 418 may be formed. A light blocking layer 424 may be formed in the OB region. The PC region may include a wiring opening portion 420 that exposes the wiring layer 408. A barrier metal layer 425 and a pad metal layer 426 may be electrically connected to the wiring layer 408 inside the wiring opening portion 420. Also, a pad insulating layer 428 having a pad opening portion 430 exposing the pad metal layer 426 and an external connection terminal connected to the pad metal layer 426 within the pad opening portion 430 may be formed in the PC region.

FIGS. 6 through 13 are cross-sectional views of a method of manufacturing the image sensor 100 having the BSI structure of FIG. 5 according to an embodiment of the inventive concept. In FIGS. 6 through 13, transistors, floating diffusion (FD) regions, and a source follower of a unit pixel are omitted from the APS region for convenience of description, and transistors are also omitted from the PC region for convenience of description.

Figure 6:
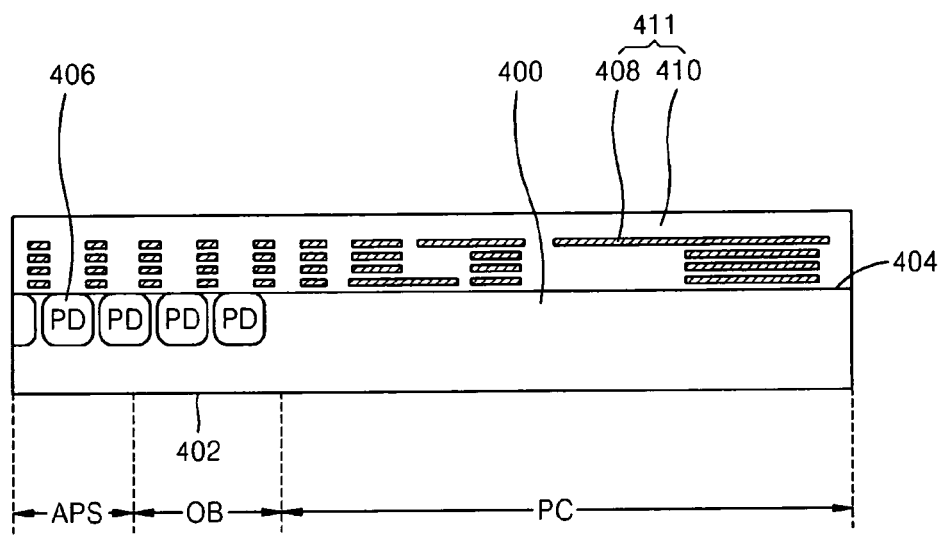
FIGS. 6 through 13 illustrate cross-sectional views of stages in a method of manufacturing the image sensor having the BSI structure of FIG. 5 according to an embodiment of the inventive concept.

Referring to FIG. 6, the semiconductor substrate 400 including a back surface 402 and the front side 404 is provided. The semiconductor substrate 400 may be a silicon wafer. The photodiode may be formed on the front side 404 of the semiconductor substrate 400. As described above, the OB region may be disposed around the APS region, and the rest is a PC region including a logic region.

The wiring unit 411 including the wiring layer 408 and the wiring insulating layer 410 may be formed on the front side 404 of the semiconductor substrate 400, i.e., on a same side as the photodiode 406. The wiring layer 408 may be formed of a plurality of metal layers disposed at different levels, which are electrically connected to one another.

Figure 7:
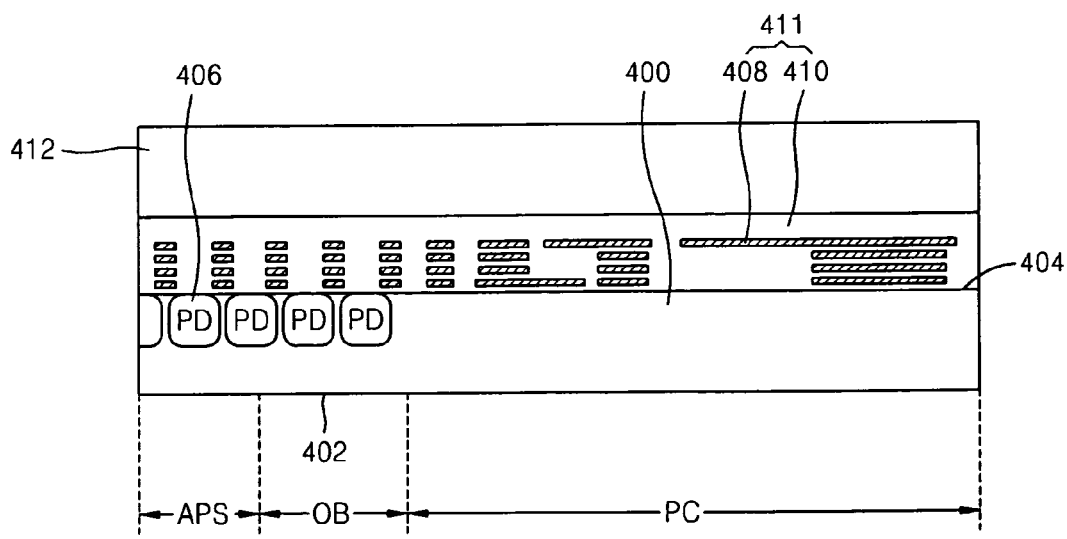

Referring to FIG. 7, the support substrate 412 may be provided. The support substrate 412 may be a silicon wafer. The support substrate 412 may be bonded to the wiring insulating layer 410 of the semiconductor substrate 400, on which the photodiode 406 and the wiring layer 408 are formed. The support substrate 412 functions as a support for the entire image sensor 100. The bonding may be performed by closely attaching the support substrate 412 to the wiring insulating layer 410 of the semiconductor substrate 400 by using a relatively high-temperature annealing process.

Figure 8:
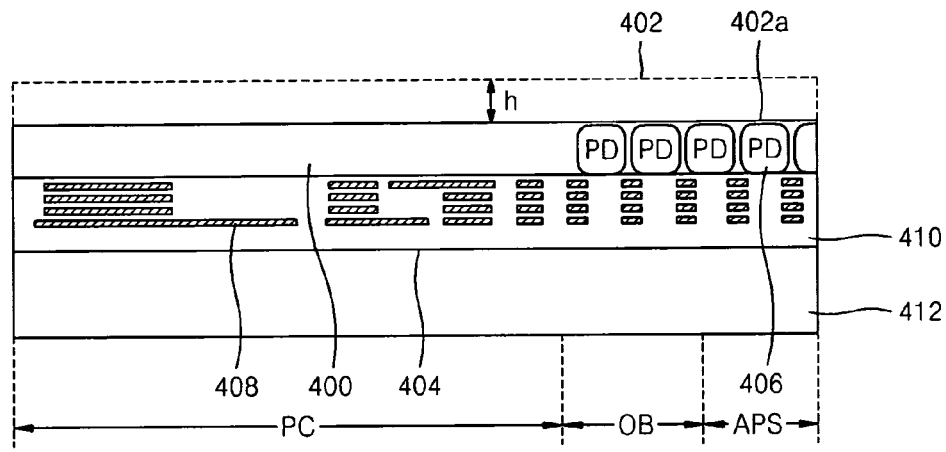

For example, referring to FIG. 8, the resultant structure of FIG. 7 may be arranged to have the support substrate 412 directed downward, i.e., as a bottom layer, so the back surface 402 of the semiconductor substrate 400 may be polished. Then, the back surface 402 of the semiconductor substrate 400 may be polished and planarized to be reduced by a height "h" to form the back side 402a. The polishing height "h" may be determined to an extent that the photodiode 406 is not damaged, e.g., so a height of the photodiode 406 may be slightly smaller than a distance between the back and front sides 402a and 404. In other words, the photodiode 406 may be between the back and front side 402a and 404 of the semiconductor substrate 400, e.g., to have a first surface substantially level with the front side 404 and a second surface slightly below the front side 402a. The polishing may be performed by using a chemical mechanical polishing (CMP) operation. Through the polishing, a thickness of the semiconductor substrate 400 may be set to several μm, e.g., 10 μm or less. By polishing the back surface 402 of the semiconductor substrate 400, the total thickness of the semiconductor substrate 400 may be reduced by the height "h" to form the back side 402a. By reducing the thickness of the semiconductor substrate 400, an optical path of light, i.e., directly irradiated (illuminated), through the resultant thin back side 402a may be reduced. Accordingly, light sensitivity may be increased and a light receiving area per unit pixel may be increased.

Figure 9:
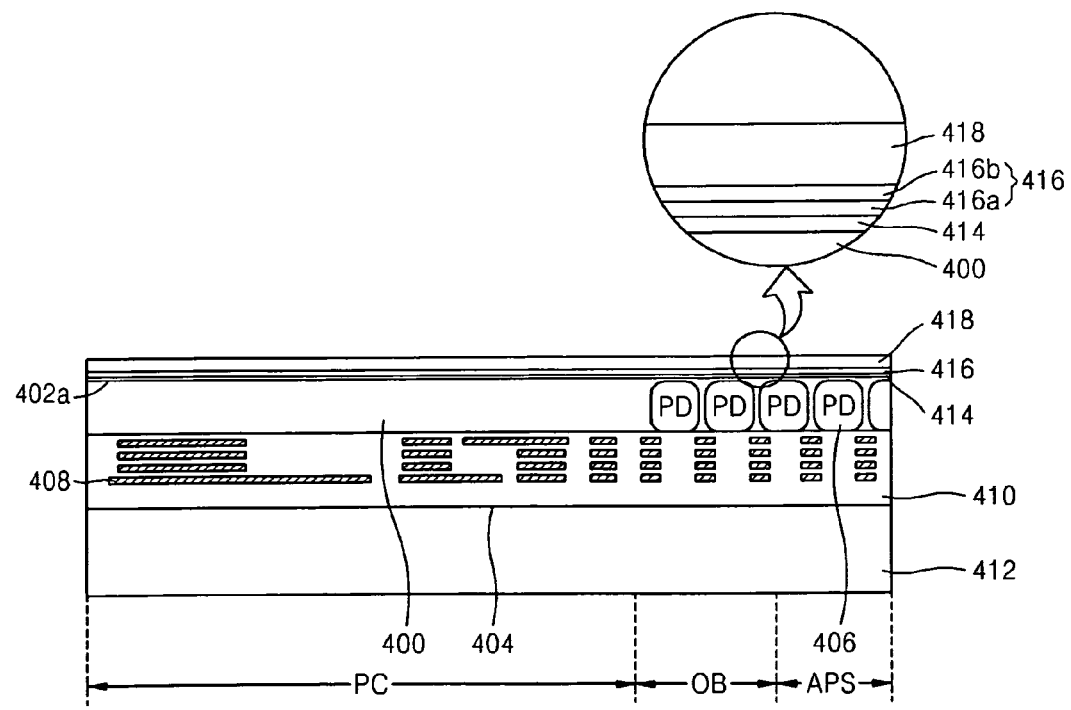

Referring to FIG. 9, the anti-reflective layer 414 may be formed on the back side 402a of the semiconductor substrate 400. The anti-reflective layer 414 is formed to prevent reflection of the light irradiated onto the back side 402a of the semiconductor substrate 400 and to increase an absorption ratio of the light into the back side 402a.

The etch stopping layer 416 may be formed on the anti-reflective layer 414. The etch stopping layer 416 may be formed to have a stack structure in which a plurality of material layers are stacked, as described above. The plurality of material layers of the etch stopping layer 416 may have different etch selectivity with respect to one another.

For example, the etch stopping layer 416 may include the first etch stopping layer 416a formed on the anti-reflective layer 414 and the second etch stopping layer 416b formed on the first etch stopping layer 416a. The second etch stopping layer 416b may be formed of a material having an etch selectivity with respect to the first etch stopping layer 416a and also with respect to an interlayer insulating layer 418, which is to be formed later. The first etch stopping layer 416a may be formed, e.g., as a silicon oxide layer or a metal oxide layer. The second stopping layer 416b may be formed as, e.g., a silicon nitride layer. The etch stopping layer 416 will be described in detail later.

The interlayer insulating layer 418 may be formed on the etch stopping layer 416. The interlayer insulating layer 418 may be formed, e.g., as a silicon oxide layer. The etch stopping layer 416 may have a function of stopping etching when the interlayer insulating layer 418 is etched. For example, the interlayer insulating layer 418 and the second etching stopping layer 416b may be about 1000 Å to about 10000 Å and about 50 Å to about 1000 Å in thickness, respectively.

Figure 10:
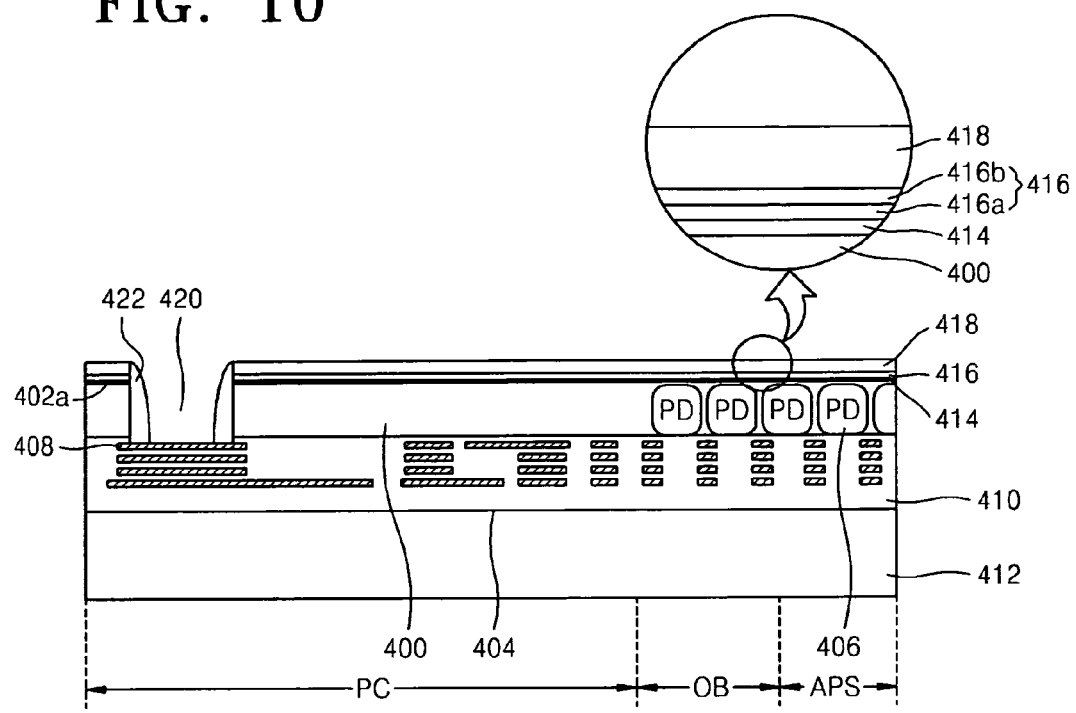

Referring to FIG. 10, the wiring opening portion 420 that exposes the wiring layer 408 may be formed by etching the interlayer insulating layer 418, the etch stopping layer 416, the anti-reflective layer 414, and a portion of the semiconductor substrate 400 in the PC region. A spacer 422 may be formed on two sidewalls of the wiring opening portion 420. The spacer 422 may be formed, e.g., as a silicon oxide layer or a silicon nitride layer.

Figure 11:
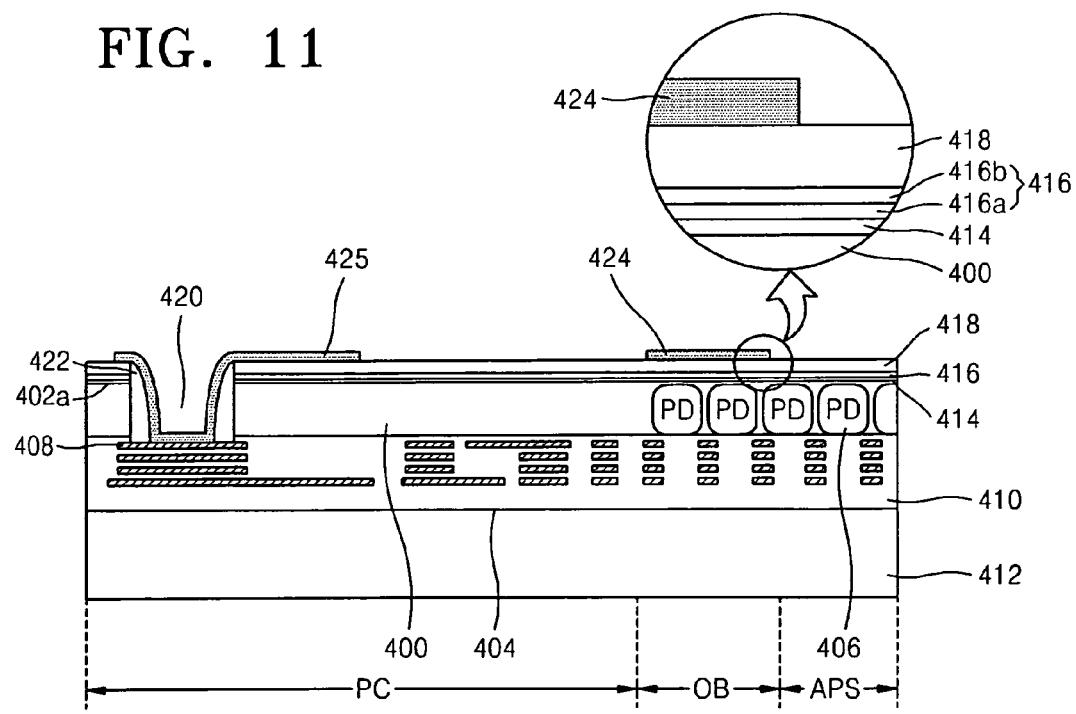

Referring to FIG. 11, a first metal layer, e.g., a tungsten layer, may be, e.g., conformally, formed on the back side 402a of the semiconductor substrate 400 and in the wiring opening portion 420, e.g., to coat the spacer 422 and the interlayer insulating layer 418. The first metal layer may be etched using a photographic etching operation according to a pattern to form the barrier metal layer 425 and the light blocking layer 424 on the interlayer insulating layer 418.

Accordingly, the barrier metal layer 425 electrically connected to the wiring layer 408 may be formed on the spacer 422 and the interlayer insulating layer 418 inside the wiring opening portion 420 of the PC region, and the light blocking layer 424 may be formed in the OB region. When forming the light blocking layer 424 in the OB region by etching the first metal layer, the interlayer insulating layer 418 of the APS region may be etched so that a thickness of the interlayer insulating layer 418 may be reduced. That is, a surface of the interlayer insulating layer 418 in the APS region may be lower than a bottom surface of the light blocking layer 424 in the OB region.

Figure 12:
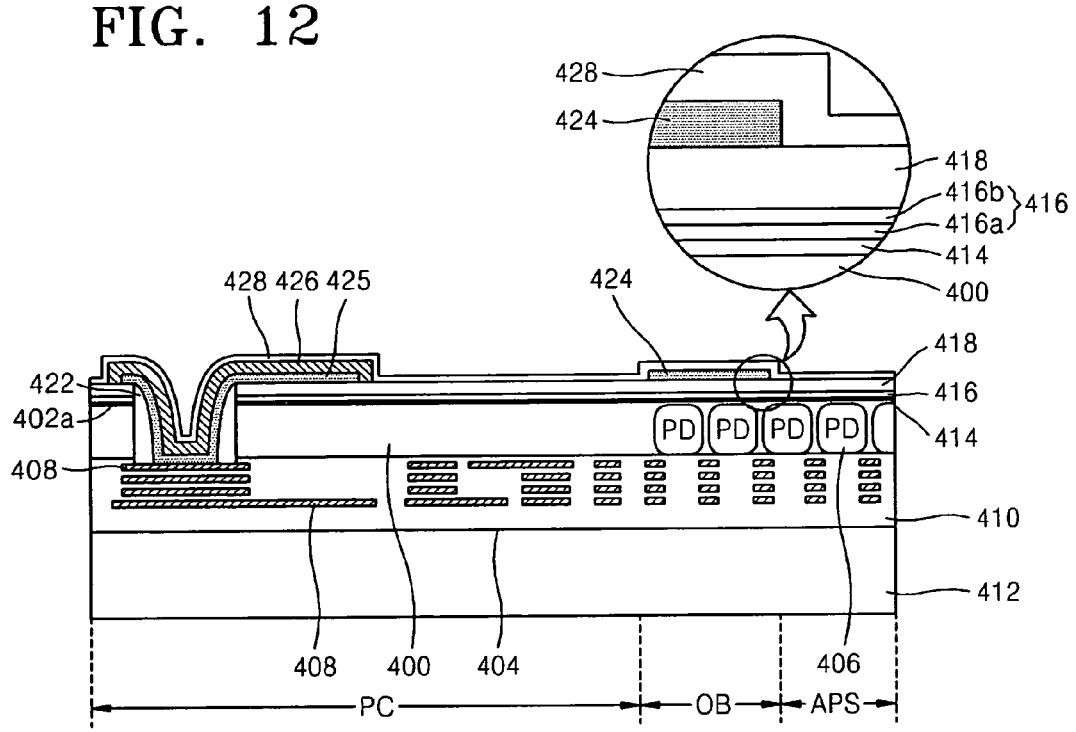

Referring to FIG. 12, a second metal layer, e.g., an aluminum layer, may be formed on the back side 402a of the semiconductor substrate 400, i.e., on which the barrier metal layer 425, the light blocking layer 424, and the interlayer insulating layer 418 are formed. The second metal layer may be etched using a photographic etching operation according to a pattern. Accordingly, the pad metal layer 426 may be formed on the barrier metal layer 425 of the PC region.

Furthermore, a pad insulating layer 428 may be formed on the back side 402a of the semiconductor substrate 400, e.g., the pad insulating layer 428 may conformally cover the pad metal layer 426, the light blocking layer 424, and the interlayer insulating layer 418 formed. The pad insulating layer 428 may be formed, e.g., of a silicon oxide layer. Thus, the interlayer insulating layer 418 and the pad insulating layer 428 may be stacked, e.g., directly on top of each other, in the APS region.

Figure 13:
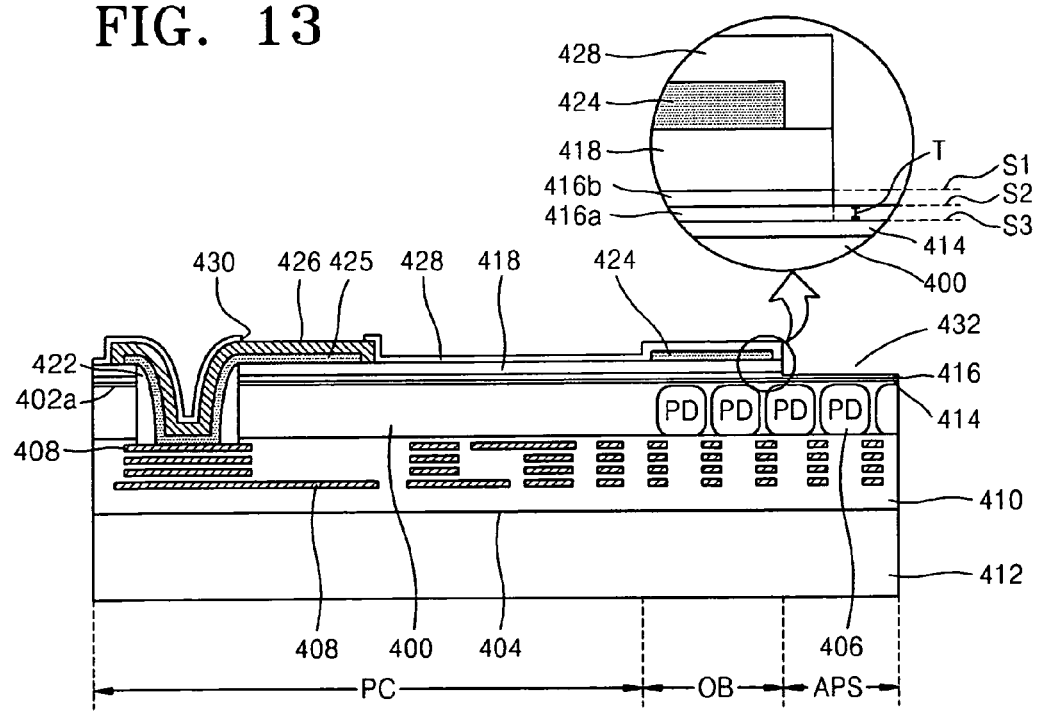

Referring to FIG. 13, a pad opening portion 430 may be formed by etching the pad insulating layer 428 to expose a portion of the pad metal layer 426 in the PC region. Also, e.g., simultaneously, the pad insulating layer 428, the interlayer insulating layer 418, and the etch stopping layer 416 of the APS region may be patterned using a photographic etching operation to expose the APS region. That is, portions of the pad insulating layer 428, the interlayer insulating layer 418, and the etch stopping layer 416 may be removed in the APS region to expose a portion of the etch stopping layer 416, thereby forming the open area 432.

The pad insulating layer 428, the interlayer insulating layer 418, and the etch stopping layer 416 of the APS region are etched in the following manner to form the open are 432 in the APS region.

First, the pad insulating layer 428 and the interlayer insulating layer 418 may be etched by using a surface of the second etch stopping layer 416*b* as an etch stopping point S1. In this first etching operation, the pad insulating layer 428 and the interlayer insulating layer 418 may be etched by using the second etch stopping layer 416*b* and an etching gas having an etch selectivity (e.g., $C_5F_8$ gas). In the first etching operation, a surface of the second etch stopping layer 416*b* may be etched partially.

Next, by using a surface of the first etch stopping layer 416*a* as an etch stopping point S2, the second etch stopping layer 416*b* may be etched. In this second etching operation, the second etch stopping layer 416*b* is etched by using the first etch stopping layer 416*a* and an etching gas having an etch selectivity (e.g., $CH_2F_2$ gas). In the second etching operation, a surface of the first etch stopping layer 416*a* may be etched partially.

In the resultant exposed APS region, a remaining portion of the first etch stopping layer 416*a* may have a small and uniform thickness T. The thickness T of the first etch stopping layer 416*a* remaining in the APS region may be from about 50 Å to about 500 Å, e.g., from about 100 Å to about 400 Å. Also, a thickness distribution of the etch stopping layer 416*a* remaining in the APS region may be reduced, e.g., within about 50 Å.

If the portion of the etch stopping layer 416*a* remaining the APS region does not have a sufficiently small and uniform thickness as described above, deterioration of characteristics of image sensors caused due to optical crosstalk and difference in characteristics of the image sensors (image sensor chips) formed in the semiconductor substrate 400 may be prevented.

Furthermore, by using a surface of the anti-reflective layer 414 as an etch stopping point S3, the etch stopping layer 416*a* may be further etched to expose the anti-reflective layer 414 in the APS region. In this case, deterioration of characteristics of image sensors caused due to optical crosstalk and difference in characteristics of the image sensors (image sensor chips) formed in the semiconductor substrate 400 may be further prevented.

Furthermore, as illustrated in FIG. 5, an external connection terminal 434 may be formed on the exposed pad metal layer 426. Accordingly, if the image sensor having a BSI structure is minimized, the pad metal layer 426 and the external connection terminal 434, which are used for electrical connection to an external device, may be easily formed.

Figure 14:
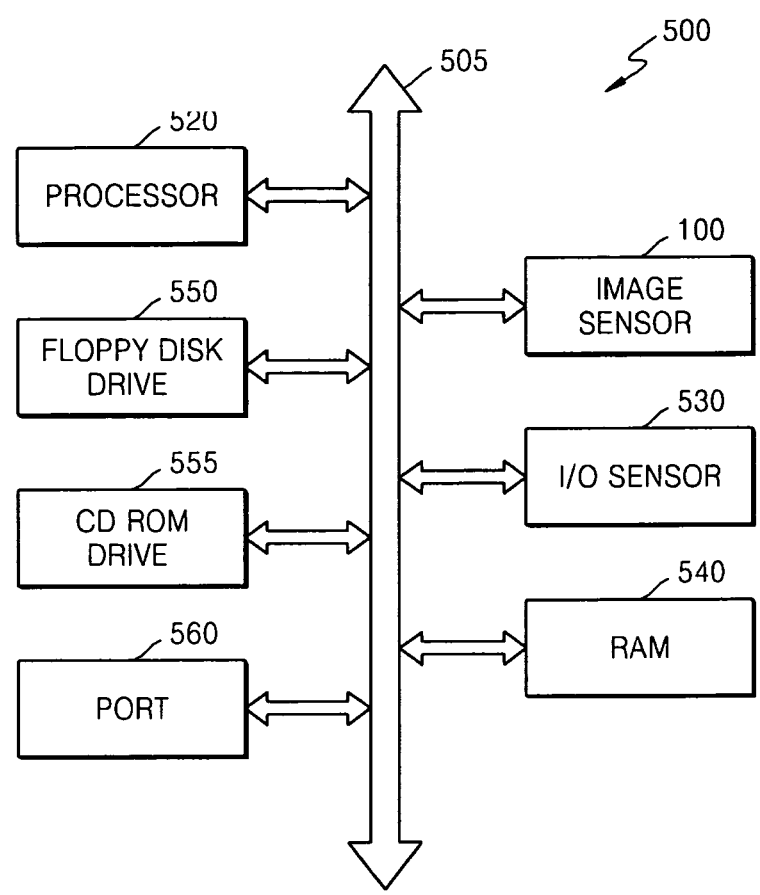
FIG. 14 illustrates a block structural diagram of an image sensor having a BSI structure according to an embodiment of the inventive concept.

FIG. 14 is a structural block diagram illustrating an imaging system 500 including an image sensor having a BSI structure according to an embodiment of the inventive concept. The imaging system 500 processes an output image of the image sensor 100 having the BSI structure described above. The imaging system 500 may be any type of electronic system, e.g., a computer system, a camera system, a scanner, or an image stabilizing system, in which the image sensor 100 is mounted.

The imaging system 500, which is a processor-based system like a computer system, may include a processor 520, e.g., a microprocessor or a central processing unit (CPU), that is capable of communicating with an input/output I/O device 530 via a bus 505. The imaging system 500 may be connected to a floppy disk drive 550, a CD ROM drive 555, a port 560, and a RAM 540 via the bus 505 in order to transmit or receive data to/from these devices and components, thereby reproducing an output image of data of the image sensor 100.

The port 560 may be a port through which a video card, a sound card, a memory card, or a USB unit may be coupled to the imaging system 500 or data is transmitted or received to and from other systems. The image sensor 100 may be integrated with a processor such as a CPU, a digital signal processor (DSP) or a microprocessor, and may also be integrated with a memory. The image system 500 may also be integrated as a separate chip from a processor. The imaging system 500 illustrated in FIG. 14 may be a system block diagram of, e.g., a camera phone or a digital camera.

Figure 15:
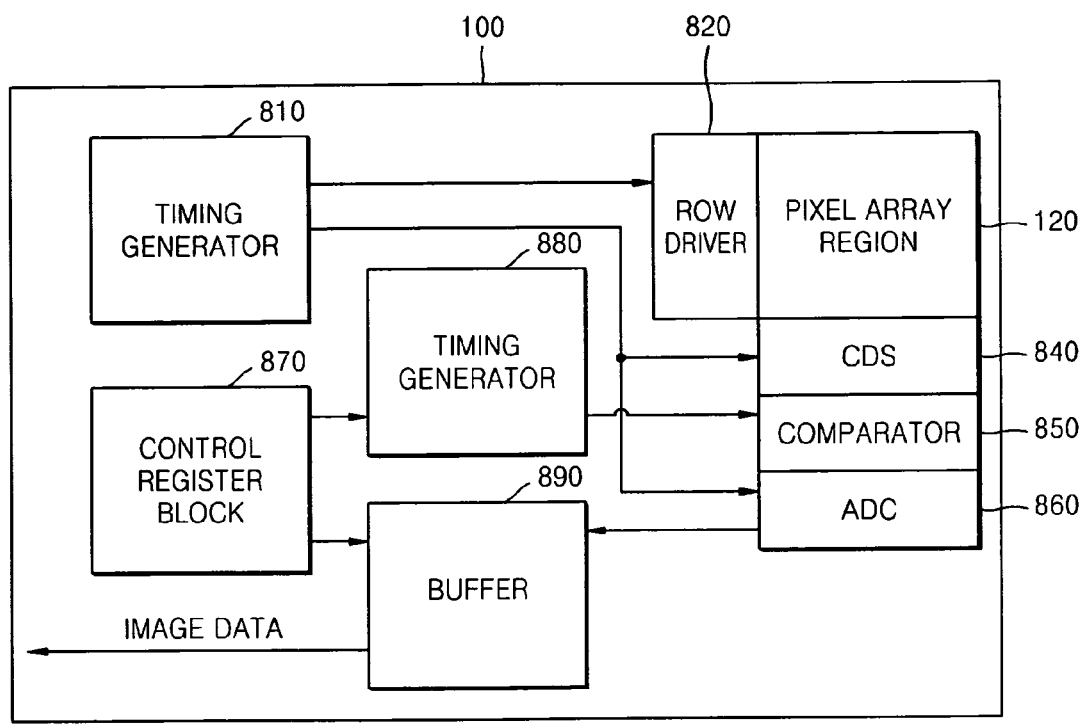
FIG. 15 illustrates a block structural diagram of an image sensor having a BSI structure formed as a separate chip according to an embodiment of the inventive concept.

FIG. 15 is a structural block diagram illustrating an image sensor 100 having a BSI structure formed as a separate chip, according to an embodiment of the inventive concept. Referring to FIG. 15, the image sensor 100 may include timing generators 810 and 880, the pixel array region 120 including the APS region 200 described above, a row driver 820, a correlated double sampling (CDS) unit 840, a comparator 850, an analog-to-digital convertor (ADC) 860, a buffer 890, and a control register block 870.

Optical data of a subject captured through an optical lens in the pixel array region 120 is converted into electrons, and the electrons are amplified to a voltage, thereby allowing noise to be removed in the CDS unit 840 and only necessary signals are selected. The comparator 850 compares the selected signals to verify whether they are consistent, and an analog signal of the consistent signals is digitized by using the ADC 860, and the digitized image data signal passes through the buffer 890 to be input to a DSP or a microprocessor and be reproduced as a subject image. The image sensor 100 is an image sensor having a BSI structure, whose sensitivity may be increased, and in which crosstalk may be reduced, by including the pixel array region 120.

According to example embodiments, an image sensor having a BSI structure may include an active-reflective layer, an etch stopping layer, and an interlayer insulating layer stacked on an APS region of a back side of the image sensor. The interlayer insulating layer and a portion of the etch stopping layer may be removed to form an etch stopping layer having a small and uniform thickness in the APS region, thereby preventing or substantially minimizing optical crosstalk in the image sensor, as wells as eliminating or substantially minimizing differences in image sensor chips formed in the semiconductor substrate. Further, a pad metal layer and an external connection terminal connected to the pad metal layer may be easily formed during the manufacture of the image sensor having a BSI structure.

In contrast, if an interlayer insulating layer with a large and an irregular thickness is stacked on, e.g., directly on, the anti-reflective layer of the APS region of the image sensor with a BSI structure, optical crosstalk may occur in the image sensor. As such, differences in characteristics of image sensor chips formed in the semiconductor substrate may occur.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A method of manufacturing an image sensor having a backside illumination (BSI) structure, the method comprising:
    forming a wiring unit on a front side of a semiconductor substrate;
    forming an anti-reflective layer in an active pixel sensor (APS) region on a back side of the semiconductor substrate, a photodiode being between the back and front sides of the semiconductor substrate;
    forming an etch stopping layer on the anti-reflective layer;
    forming an interlayer insulating layer on the etch stopping layer, the interlayer insulating layer having an etch selectivity with respect to the etch stopping layer; and
    etching the interlayer insulating layer in the APS region using the etch stopping layer as an etch stopping point.

2. The method as claimed in claim 1, wherein forming the etch stopping layer includes sequentially forming a first etch stopping layer and a second etch stopping layer on the anti-reflective layer, the second etch stopping layer having an etch selectivity with respect to each of the first etch stopping layer and the interlayer insulating layer.

3. The method as claimed in claim 2, further comprising etching the second etch stopping layer, wherein:
    etching the interlayer insulating layer includes using the second etch stopping layer as the etch stopping point; and
    etching the second etch stopping layer includes using the first etch stopping layer as an additional etch stopping point.

4. The method as claimed in claim 2, wherein the interlayer insulating layer and the first etch stopping layer are formed of silicon oxide, and the second etch stopping layer is formed of silicon nitride.

5. The method as claimed in claim 1, wherein etching the interlayer insulating layer includes reducing a thickness of the etch stopping layer, the reduced thickness of the etch stopping layer being substantially uniform in the APS region.

6. The method as claimed in claim 5, wherein reducing the thickness of the etching stopping layer includes forming a layer with a thickness of about 50 Å to about 500 Å.

7. The method as claimed in claim 1, further comprising, after etching the interlayer insulating layer, etching the etch stopping layer to expose the anti-reflective layer in the APS region.

8. The method as claimed in claim 1, further comprising, after forming the wiring unit on the front side of the semiconductor substrate:
    attaching a support substrate to the wiring unit; and
    polishing the back side of the semiconductor substrate.

9. A method of manufacturing an image sensor having a backside illumination (BSI) structure, the method comprising:
    forming a wiring unit on a front side of a semiconductor substrate, the wiring unit including a wiring layer;
    forming an anti-reflective layer in an active pixel sensor (APS) region and in a peripheral circuit (PC) region on a back side of the semiconductor substrate, a photodiode being between the back and front sides of the semiconductor substrate;
    forming an etch stopping layer on the anti-reflective layer;
    forming an interlayer insulating layer on the etch stopping layer, the interlayer insulating layer having an etch selectivity with respect to the etch stopping layer;
    forming a pad metal layer in the PC region, the pad metal layer being electrically connected to the wiring layer;
    forming a pad insulating layer having a pad opening portion on the back side of the semiconductor substrate, the pad opening portion exposing the pad metal layer;
    etching the interlayer insulating layer in the APS region using the etch stopping layer as an etch stopping point; and
    forming an external connection terminal on the pad metal layer through the pad opening portion.

10. The method as claimed in claim 9, wherein forming the pad metal layer includes:
    forming a wiring opening portion to expose the wiring layer by etching the interlayer insulating layer, the etch stopping layer, the anti-reflective layer of the PC region, and the back side of the semiconductor substrate of the PC region;
    forming a barrier metal layer in the wiring opening portion, the barrier metal layer being electrically connected to the wiring layer; and
    forming the pad metal layer on the barrier metal layer.

11. The method as claimed in claim 10, further comprising forming a light blocking layer along a circumference of the APS region of the back side of the semiconductor substrate when forming the barrier metal layer.

12. The method as claimed in claim 10, further comprising, before forming the wiring opening portion, polishing the back side of the semiconductor substrate.

13. The method as claimed in claim 9, wherein etching the interlayer insulating layer includes reducing a thickness of the etch stopping layer, the reduced thickness of the etch stopping layer being substantially uniform in the APS region.

14. The method as claimed in claim 9, wherein forming the etch stopping layer includes forming a stack structure of a plurality of material layers.

15. The method as claimed in claim 14, wherein forming the plurality of material layers includes forming layers having etch selectivity with respect to one another.

16. A method of manufacturing an image sensor having a backside illumination (BSI) structure, the method comprising:
    forming a wiring unit on a front side of a semiconductor substrate, at least one photodiode being in the semiconductor substrate;
    forming an anti-reflective layer on a back side of the semiconductor substrate, the front and back sides of the semiconductor substrate being opposite each other;
    forming an interlayer insulating layer on the back side of the semiconductor substrate, excluding an active pixel sensor (APS) region of the semiconductor substrate, such that a total thickness of layers in the APS region on the back side of the semiconductor substrate is smaller than a total thickness of layers in other regions on the back side of the semiconductor substrate.

17. The method as claimed in claim 16, further comprising:
    forming an etch stopping layer on the anti-reflective layer;
    forming the interlayer insulating layer on the etch stopping layer, the interlayer insulating layer having an etch selectivity with respect to the etch stopping layer; and etching the interlayer insulating layer in the APS region using the etch stopping layer as an etch stopping point.

18. The method as claimed in claim 16, wherein forming the interlayer insulating layer includes exposing the anti-reflective layer in the APS region.

19. The method as claimed in claim 16, further comprising forming an etch stopping layer on the anti-reflective layer, before forming the interlayer insulating layer, such that one of the etch stopping layer and the anti-reflective layer is exposed in the APS region.

20. The method as claimed in claim 19, wherein exposing one of the etch stopping layer and the anti-reflective layer in the APS region includes reducing a thickness of a respective one of the etch stopping layer and the anti-reflective layer, the reduced thickness being substantially uniform in the entire APS region.

\* \* \* \* \*